(12) United States Patent
Dulieu et al.

(10) Patent No.: US 11,678,455 B2
(45) Date of Patent: Jun. 13, 2023

(54) DIGITAL DISPLAY PANEL MODULE AND ASSOCIATED DIGITAL DISPLAY PANEL

(71) Applicant: PRISMAFLEX INTERNATIONAL, Haute-Rivoire (FR)

(72) Inventors: William Dulieu, Montrond les Bains (FR); Jeffrey-Changbing Jiang, Lissieu (FR)

(73) Assignee: PRISMAFLEX INTERNATIONAL, Haute-Rivoire (FR)

( * ) Notice: Subject to any disclaimer, the term of this patent is extended or adjusted under 35 U.S.C. 154(b) by 0 days.

(21) Appl. No.: 17/487,757

(22) Filed: Sep. 28, 2021

(65) Prior Publication Data
US 2022/0104382 A1    Mar. 31, 2022

(30) Foreign Application Priority Data
Sep. 28, 2020    (FR) ........................... 2009858

(51) Int. Cl.
     *H05K 7/14*      (2006.01)
     *H05K 7/20*      (2006.01)
     *G09F 9/33*      (2006.01)

(52) U.S. Cl.
CPC ............ *H05K 7/1457* (2013.01); *G09F 9/33* (2013.01); *H05K 7/1452* (2013.01); *H05K 7/20963* (2013.01)

(58) Field of Classification Search
CPC .............. H05K 7/1457; H05K 7/1452; H05K 7/20963; G09F 9/33
See application file for complete search history.

(56) References Cited

U.S. PATENT DOCUMENTS 5,930,428 A * 7/1999 Irwin ................... G02B 6/4284
                                                    385/88
5,949,581 A    9/1999 Kurtenbach et al.
(Continued)

FOREIGN PATENT DOCUMENTS

| CN | 204129273 U | 1/2015 |
|---|---|---|
| CN | 111383550 A | 7/2020 |

OTHER PUBLICATIONS

Andersson H M E, Connector Assembly, EP-3557698-A1, Oct. 2019 (Year: 2019).*

(Continued)

*Primary Examiner* — Michael A Matey
(74) *Attorney, Agent, or Firm* — Marshall, Gerstein & Borun LLP

(57) ABSTRACT

A module for a digital display panel includes a circuit board, a first face of which presents a network of light emitting diodes. The module also includes a chassis fixed on a second face of the circuit board, and a water permeable connector mounted on the circuit board. The chassis includes a base around the water permeable connector, a top part of the base having at least one groove, wherein a seal is inserted. Further, the module includes a power supply unit fitted with a continuous voltage connector surrounded by a ferrite and fitted in the water permeable connector. The power supply unit is attached to the chassis so that a lower plate of the power supply unit co-operates with the seal of the base to ensure a seal around the water permeable connector and the DC voltage connector of the power supply unit.

10 Claims, 5 Drawing Sheets

(56) References Cited

U.S. PATENT DOCUMENTS

| | | | | |
|---|---|---|---|---|
| 6,169,632 B1* | 1/2001 | Kurtenbach | ............ | G09F 9/33 |
| | | | | 359/620 |
| 6,329,593 B1* | 12/2001 | Yang | ................. | G09F 27/008 |
| | | | | 174/559 |
| 7,682,043 B2* | 3/2010 | Malstrom | ............ | G09F 9/3026 |
| | | | | 362/147 |
| 8,154,864 B1* | 4/2012 | Nearman | ............ | G09F 9/3026 |
| | | | | 361/679.01 |
| 8,172,097 B2* | 5/2012 | Nearman | ............ | H05K 9/0054 |
| | | | | 211/189 |
| 8,350,788 B1* | 1/2013 | Nearman | ............ | G09F 27/008 |
| | | | | 345/82 |
| 11,199,309 B1* | 12/2021 | Benecke | ............ | G09F 27/008 |
| 2014/0153241 A1 | 6/2014 | Templeton | | |
| 2020/0081046 A1* | 3/2020 | Pechstein | ............ | G08C 17/04 |

OTHER PUBLICATIONS

French Search Report issued in French Patent Application No. 2009858 dated Jun. 11, 2021.

\* cited by examiner

DIGITAL DISPLAY PANEL MODULE AND ASSOCIATED DIGITAL DISPLAY PANEL

TECHNICAL FIELD

The present disclosure relates to the field of display panels, and more specifically to digital display panels with light emitting diodes. More specifically, the present disclosure relates to a sealed module for forming such a digital display panel.

BACKGROUND

In general, digital display panels are valued for the possibility that they offer to allow an almost infinite change in the images or messages to be displayed, only limited by the memory capacity of the electronic control unit that controls such panels. These panels also have the advantage of being able to display animated images, making them an increasingly popular advertising medium. These panels can also be connected to a remote server to modify a display campaign, broadcast on the panel, quickly and without operator intervention.

These digital display panels comprise a plurality of light emitting diodes (LEDs), arranged in a matrix, and capable of being individually lit according to the desired display. Various hardware architectures can be considered, and in particular those described in U.S. Pat. No. 5,949,581, wherein the panel contains a plurality of modules, each containing a few hundred LEDs.

Typically, the modules are assembled in sealed cabinets with several rows and columns of modules. Several cabinets can then be assembled, also into several rows and columns of cabinets to form the digital display panel.

To limit the weight of the digital display panel, it is known to eliminate cabinets by using sealed modules mounted directly on a panel structure. To do this, each module must be able to process the data to be displayed and receive the power required for the operation of the electronic circuits and light emitting diodes.

In general, a module contains a circuit board with a first face showing a network of light emitting diodes arranged in rows and columns with a substantially constant pitch. The second face of the circuit board incorporates the LED management circuit as well as the connectors for power and data.

To obtain a sealed module, the connectors on the module that receive power and data are typically sealed connectors. When the connectors are attached to the second face of the circuit board, the second face is covered with a resin that seals the components.

However, sealed connectors for modules are particularly complex and expensive. Furthermore, with particular reference to power supply, some of the sealed connectors cause electromagnetic interference because the wires in these connectors are fed through relatively high current levels of up to tens of Amps, and because the module is supplied with low voltage with significant harmonic components. To overcome this problem of electromagnetic interference, it has already been proposed to use flexible connectors, on which a ferrite block is mounted, forming an inductance on the power circuit, intended to attenuate high frequency currents. The implantation of this ferrite block requires the use of flexible conductors, coupled with connectors sealed by welds or connections that are weak points of the assembly.

In addition, sealed connectors are complex to assemble and disassemble because they incorporate several sealing rings.

Thus, each time the connector is handled, it may degrade the sealing ensured by the connector, limiting the maintenance operations of the module.

The technical problem is therefore to provide a sealed module with connectors that are easier to handle and limit electromagnetic disturbances.

SUMMARY OF THE DISCLOSURE

To answer this technical problem, the present disclosure proposes to use a power supply box with a DC voltage connector incorporating a ferrite so as to limit electromagnetic disturbances. To ensure sealing and facilitate maintenance operations, the DC voltage connector of the power supply unit is inserted into a water-permeable connector of the circuit board in a sealed environment. The sealed environment is created by a base plate, on which a joint is mounted, cooperating with a bottom plate of the power box.

For this purpose, according to a first aspect, the present disclosure relates to a module for digital display panel, comprising:
  an electronic board whose first face presents a network of light emitting diodes arranged in rows and columns with a substantially constant pitch;
  a chassis mounted on a second face of the circuit board, opposite the first face; and
  a water permeable connector mounted on the second face of the circuit board.

In embodiments, the present disclosure is characterized in that the chassis comprises a receptacle surrounding the water-permeable connector, a top part of the receptacle having at least one groove, wherein a seal is inserted. The module comprises a power supply unit fitted with a continuous voltage connector surrounded by a ferrite and inserted into the water permeable connector.

The power supply unit is attached to the chassis so that a lower plate of the power supply unit co-operates with the seal of the base plate to ensure sealing around the water permeable connector and the DC voltage connector of the power supply unit.

The disclosed embodiments thus allow to obtain a sealed module with an easily dismantled power unit, since it is sufficient to detach the power unit from the chassis to remove the power unit. In this configuration, the bottom plate of the power box no longer cooperates with the seal and the DC voltage connector of the power box can simply be extracted from the water permeable connector of the circuit board.

In addition, the connection between the power box electronic circuit and the module electronic board is via a single conductor by polarity, on one side welded to the power box board and on the other side, plugged into a socket soldered onto the module circuit board. Electromagnetic disturbances are limited by the presence of the ferrite built into the power box. This ferrite is present around the DC voltage connector conductive elements, which are in practice straight lines.

For example, the ferrite core can be between 25 and 30 mm in height, with an internal diameter between 15 and 20 mm and an external diameter between 25 and 30 mm so as to surround a continuous voltage connector with an external diameter slightly smaller than the internal diameter of the ferrite.

Preferably, to ensure the reversibility of the mounting between the power supply unit and the chassis, the mounting of the power supply unit on the chassis is ensured by at least two screws through an opening in the power supply lower plate and screwed into chassis mounting studs.

For example, four mounting screws can be used and mounting locating lugs can be left on the chassis to cooperate with openings in the bottom plate.

In addition to the sealing ensured by the cooperation of the supply unit lower plate and the base seal, the sealing of the supply unit is preferentially ensured by a thermal resin injected into the supply unit. Alternatively or in addition, the sealing between the cover and the bottom plate can be ensured by a seal squeezed at the interface between the cover and the bottom plate.

To do this, the power supply unit preferentially incorporates a cover attached to the bottom plate, a thermal resin being injected into the power supply unit between the cover and the bottom plate. This thermal resin can be obtained by the assembly of two compounds, for example an epoxy resin and a hardener.

This thermal resin allows the heat generated by the components of the power box to be conducted to the cover. Then, the cover diffuses heat in its environment by convection. To do this, the cover is preferably made of aluminum and incorporates heat dissipation fins. In addition, the bottom plate can also be made of aluminum.

The power supply unit thus enables a transformation of the voltage from an electrical supply cable, typically an AC voltage, into a DC voltage to power the management circuit and the light emitting diodes in a sealed environment. The AC voltage can be routed through a cable inserted into a sealed opening in the power box.

Preferably, the power supply unit has a sealed alternating connector to cooperate with a sealed alternating connector of a power supply cable. This embodiment makes it easier to install the power unit because the electrical cable can be connected after the power unit is attached and it is possible to replace only the electrical cable or the power unit in the event of a failure.

To ensure the sealing of this sealed AC connector in the storage phases of the power box, the sealed AC connector of the power box preferably includes a plug to protect the sealed AC connector when the power cable is not connected with the power box.

Furthermore, the joint providing the sealing between the base and the supply unit must be correctly positioned to avoid any potential leaks. To do this, the top end of the flange can have two grooves and the seal then has a first face with two lips entering the two grooves of the flange and a second face with a hemicylindrical shape.

In addition, to ensure the mechanical holding of the circuit board while allowing the heat dissipation of the energy released by the light emitting diodes, the chassis preferably incorporates a central grid, on which the base is mounted.

In a second aspect, the disclosed embodiments relate to a digital display panel comprising a set of modules according to the first aspect, juxtaposed into rows and/or columns.

BRIEF DESCRIPTION OF THE FIGURES

The disclosed embodiments and their advantages will become more apparent from the following disclosure, given by way of a non-limiting example, supported by the attached figures wherein

FIG. 1: a schematic depiction of the back in perspective of a module according to one embodiment; and FIG. 2: an exploded layout of the module of FIG. 1;

FIG. 3: a schematic representation in perspective of the circuit board of the module of FIG. 1;

FIG. 4: a schematic representation in perspective of the chassis and of the circuit board of the module of FIG. 1;

FIG. 5: a schematic representation from below of the chassis of the module of FIG. 1;

FIG. 6: a schematic representation from below of a power box mounted on the chassis of FIG. 5;

FIG. 7: a schematic representation in perspective of the power box of FIG. 6;

FIG. 8: a partial, open representation in perspective of the power box of FIG. 6.

DETAILED DESCRIPTION

Figure 1:
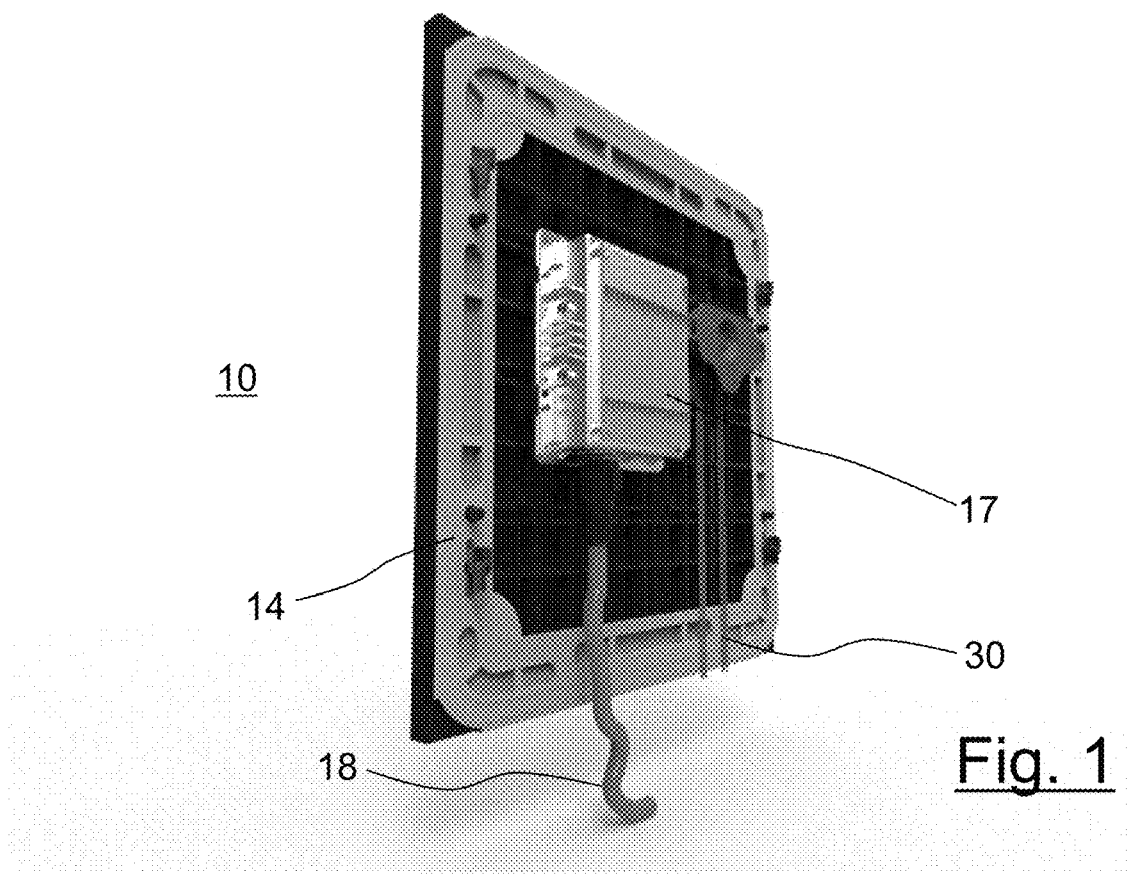
FIGS. 1 to 8 represent.
Figure 2:
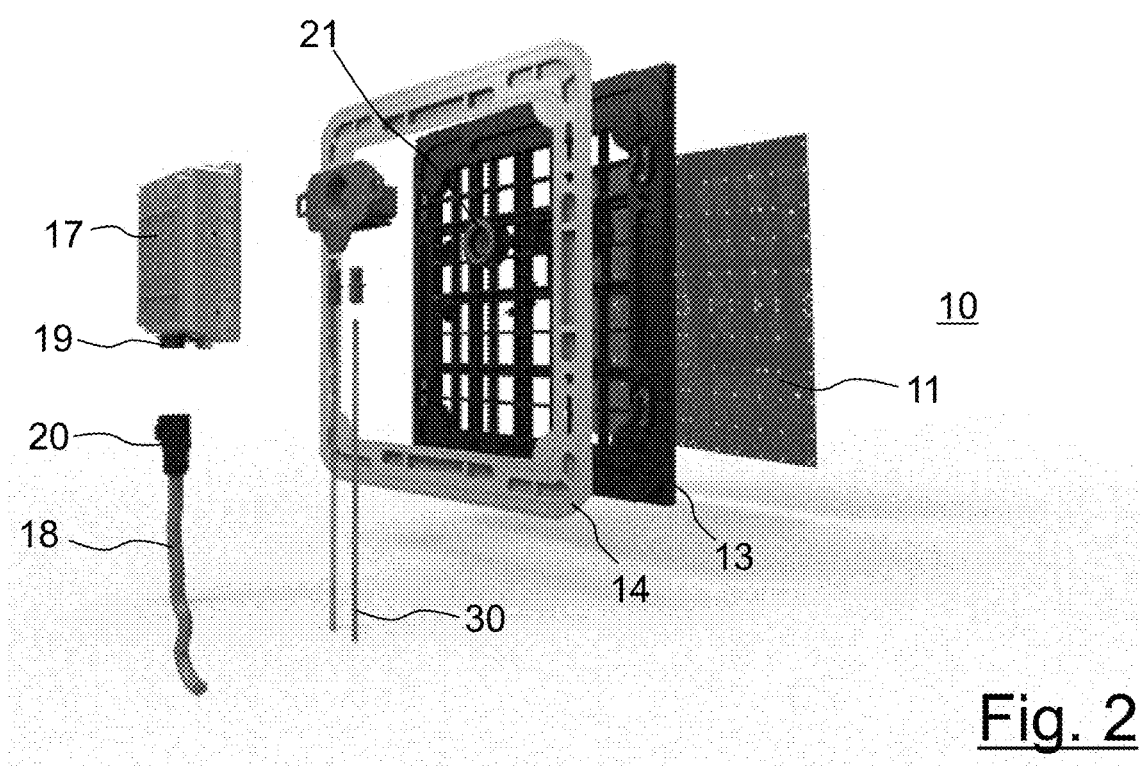
Figure 3:
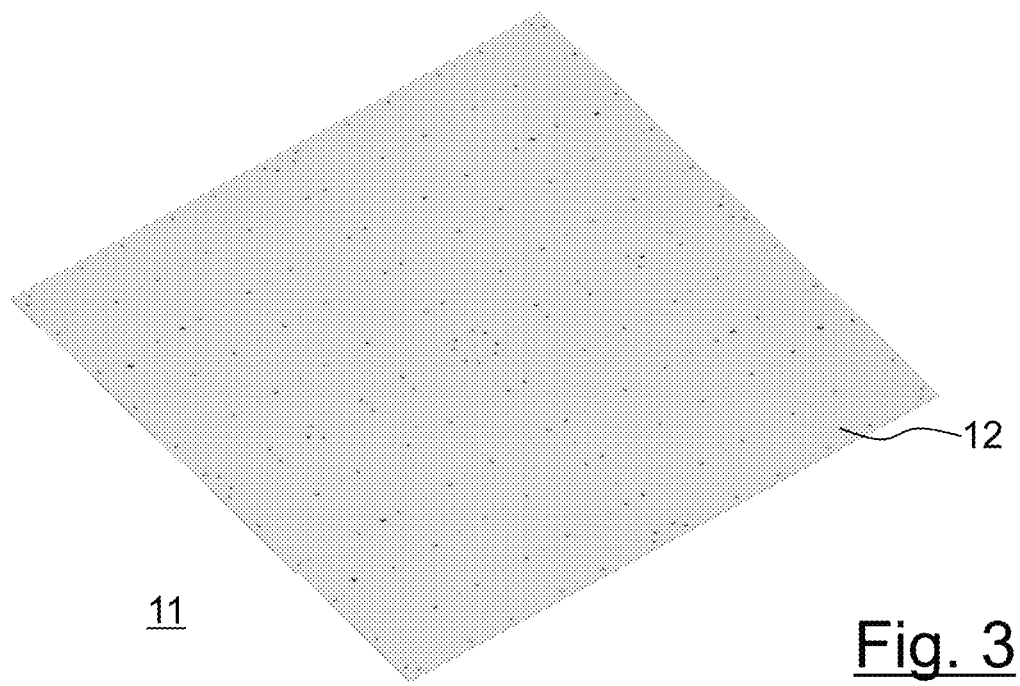

FIGS. 1 and 2 show a LED module, i.e. a module 10 containing an circuit board 11 with a first face showing a network of light emitting diodes (or LEDs) arranged in rows and columns with a substantially constant pitch. The pitch between two LEDs can vary depending on the application, for example the pitch can be 4, 6 or 8 mm. The assembly of the light emitting diodes is welded onto a first face of the circuit board 11. As shown in FIG. 3, this circuit board 11 has holes ending on a second face 12 of the circuit board 11 so that a chassis 13 can be attached.

This chassis 13 has a center grid 15 that ensures the mechanical holding of circuit board 11 while allowing the thermal dissipation of the energy released by the light emitting diodes. On the edges of the frame 13, a mounting plate 14 is fitted. The purpose of this mounting plate 14 is to mount the module 10 to form a digital display panel. A digital display panel typically consists of several modules 10 that are placed in a row and/or in a column to form a large display surface.

Typically, a module 10 can have dimensions of the order of 40 by 43 cm, and the display surface of a digital display panel can vary depending on the application, for example 6 m by 3 m, 4 m by 2 m, etc.

The disclosed embodiments relate to a sealed LED module 10. As used herein, a "sealed" module is a module, which is capable of withstanding a low pressure water spray on all its faces. To ensure the sealing of the light emitting diodes, the front face of the circuit board 11, that is, the face intended to form the display surface, can be covered with a transparent resin.

In the same way, the rear face 12 of the circuit board 11 can be covered with a heat resin configured to allow the heat dissipation of the electronic circuit and the LEDs mounted on the circuit board 11.

To obtain the desired operation of a LED module 10, it is also necessary to route the power supply and the data to control the display surface. In the example in FIGS. 1 and 2, the data is transmitted through optical fibers 30 by a sealed connector or a sealing element around a water-permeable connector.

More specifically, the present embodiments relate to a sealed power supply housing 17 for converting electrical energy from a cable 18 to a water permeable connector 16 soldered onto the circuit board 11. Classically, the transformation carried out in power supply box 17 corresponds to a continuous alternating conversion based on a voltage rectifier assembly.

Typically, cable 18 can be connected to a low-voltage network, for example a 220 V alternating voltage network with a frequency of 50 Hz and a nominal current of 2 A. At the output of power box 17, a DC voltage connector 28 supplies the circuit board 11 with a DC voltage between 3 and 12 V and a current between 10 and 60 A. For example, the DC voltage connector 28 may have a voltage of 4.2 V and a current of 40 A.

The mounting of the power supply unit 17 on the chassis 13 is ensured by screws passing through a bottom plate 25 of the power supply unit 17 cooperating with mounting studs 22 of the chassis 13. Furthermore, the continuous voltage connector 28 of the power supply unit 17 is inserted into the water permeable connector 16 welded onto the circuit board 11.

To ensure sealing around these two connectors 16, 28, a receptacle 21 is provided on the chassis 13 around the water permeable connector 16.

Figure 4:
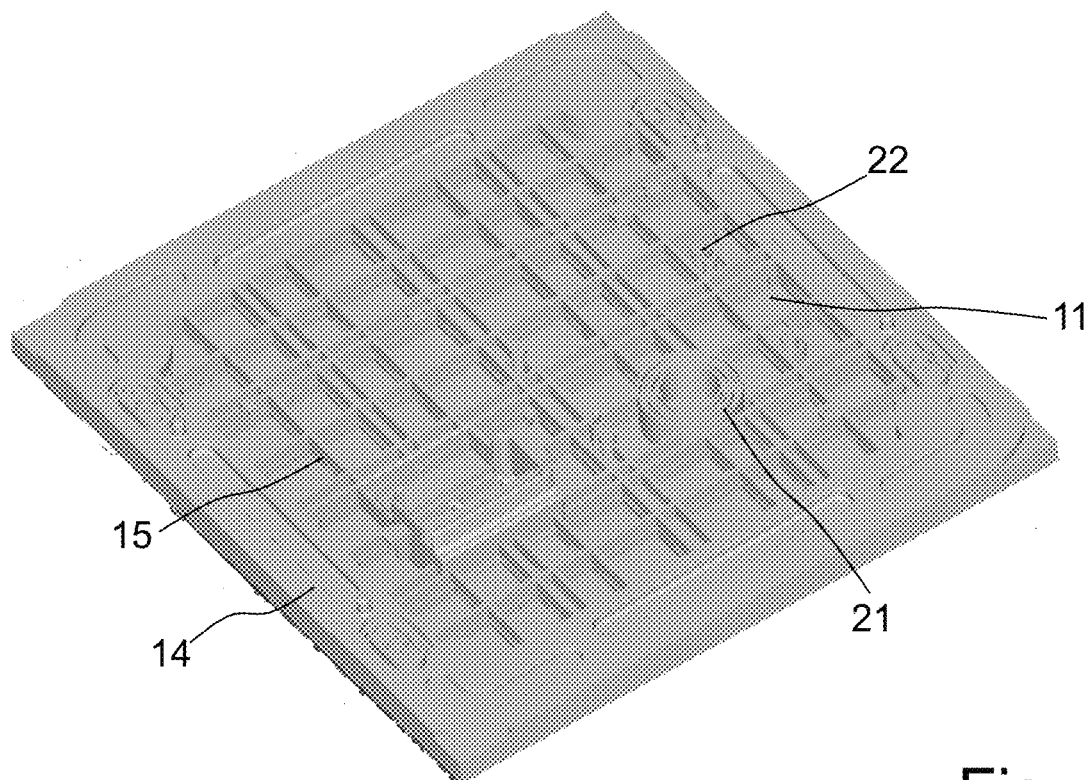
Figure 5:
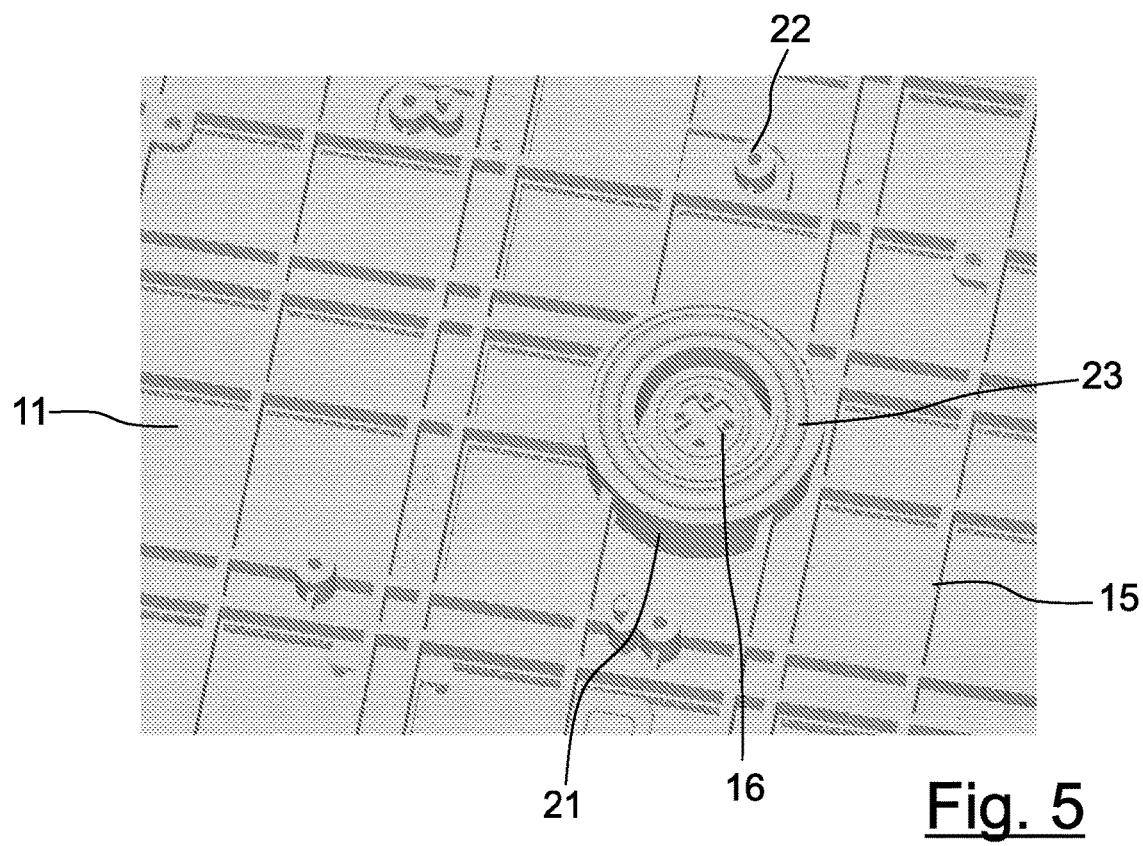
Figure 6:
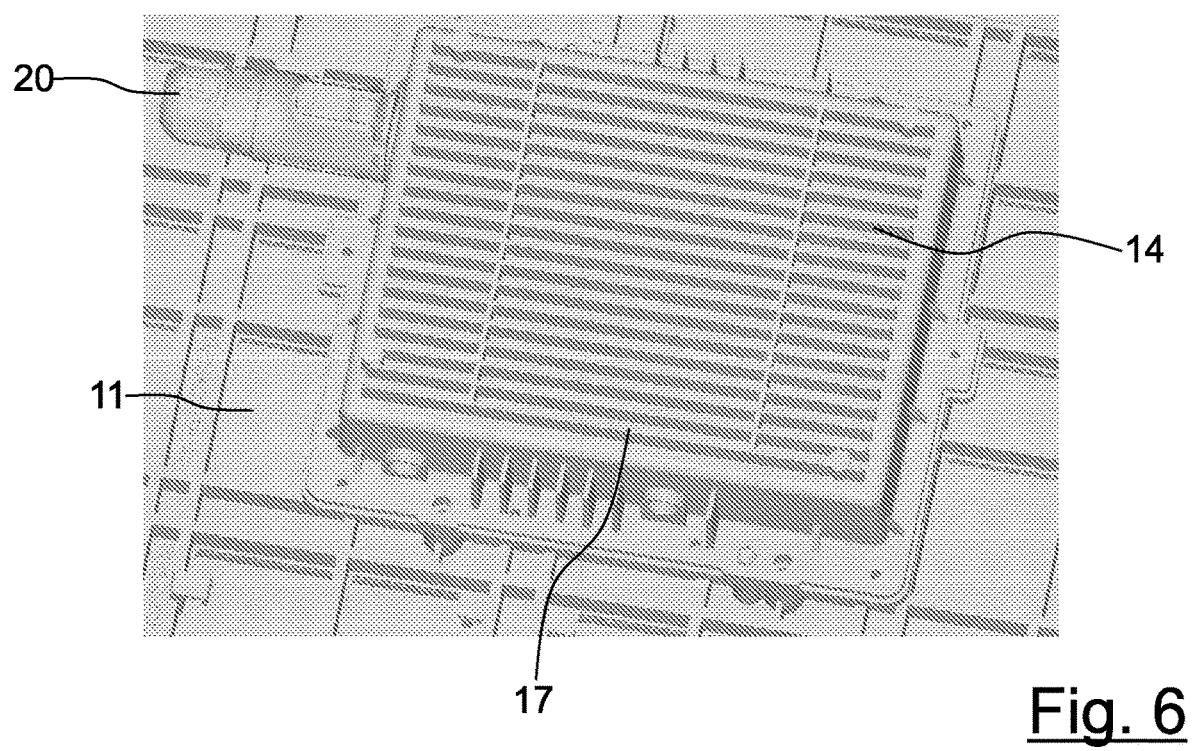
Figure 9:
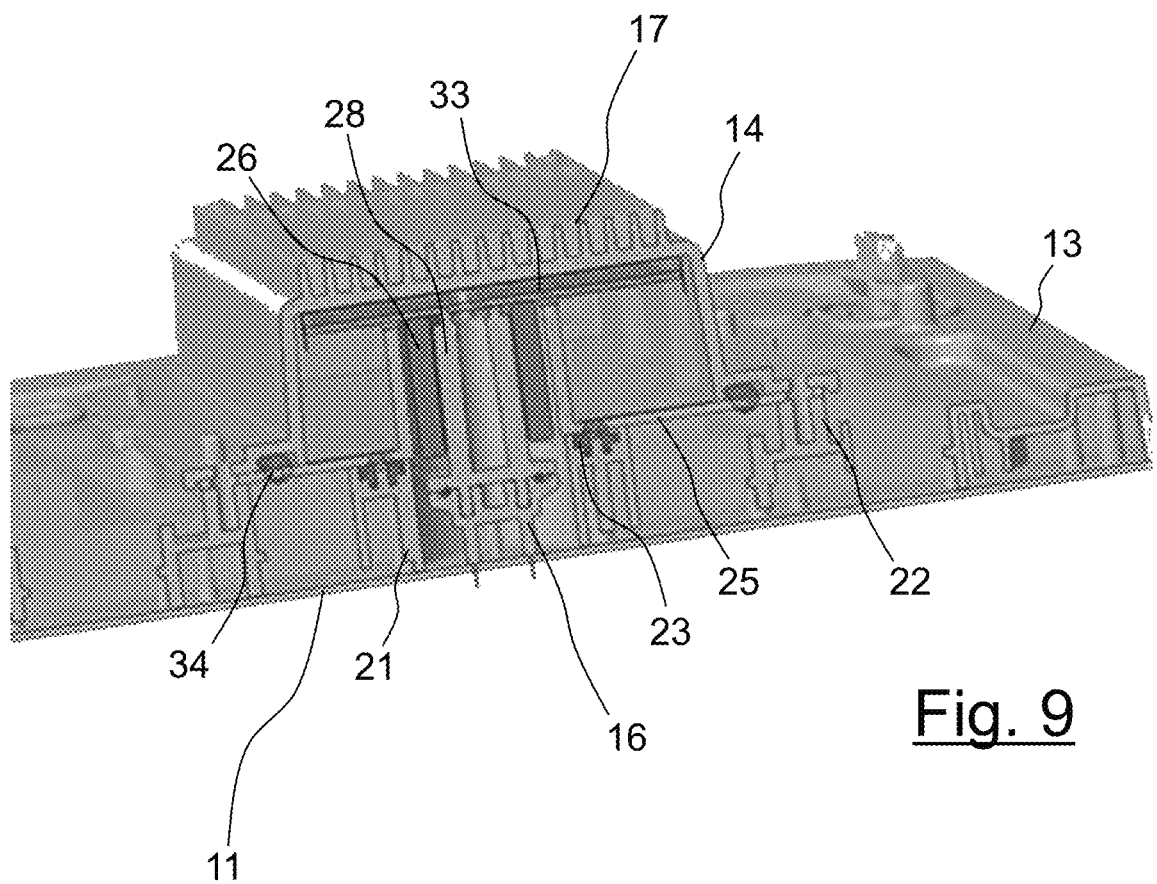
FIG. 9: a schematic section representation of the power box of FIG. 6.

As shown in FIGS. 4 and 5, this flange 21 has a cylindrical shape and the top end of this cylindrical shape has at least one groove, wherein an O-ring 23 is placed. Preferably, the top end of the base 21 has two grooves, as shown in FIGS. 4 and 9. The seal 23 then has a first face with two lips entering the two grooves and a second face with a hemicylindrical shape.

The sealing around the two connectors 16, 28 is ensured by cooperation between the lower plate 25 of the power unit 17 and the seal 23. Indeed, when the bottom plate 25 is screwed on the mounting studs 22 of the chassis 13, it compresses the seal 23 and ensures the sealing around the connectors 16, 28 so that it is possible to reduce the stresses on the connectors 16, 28 and to use connectors 16, 28 permeable to water.

Figure 7:
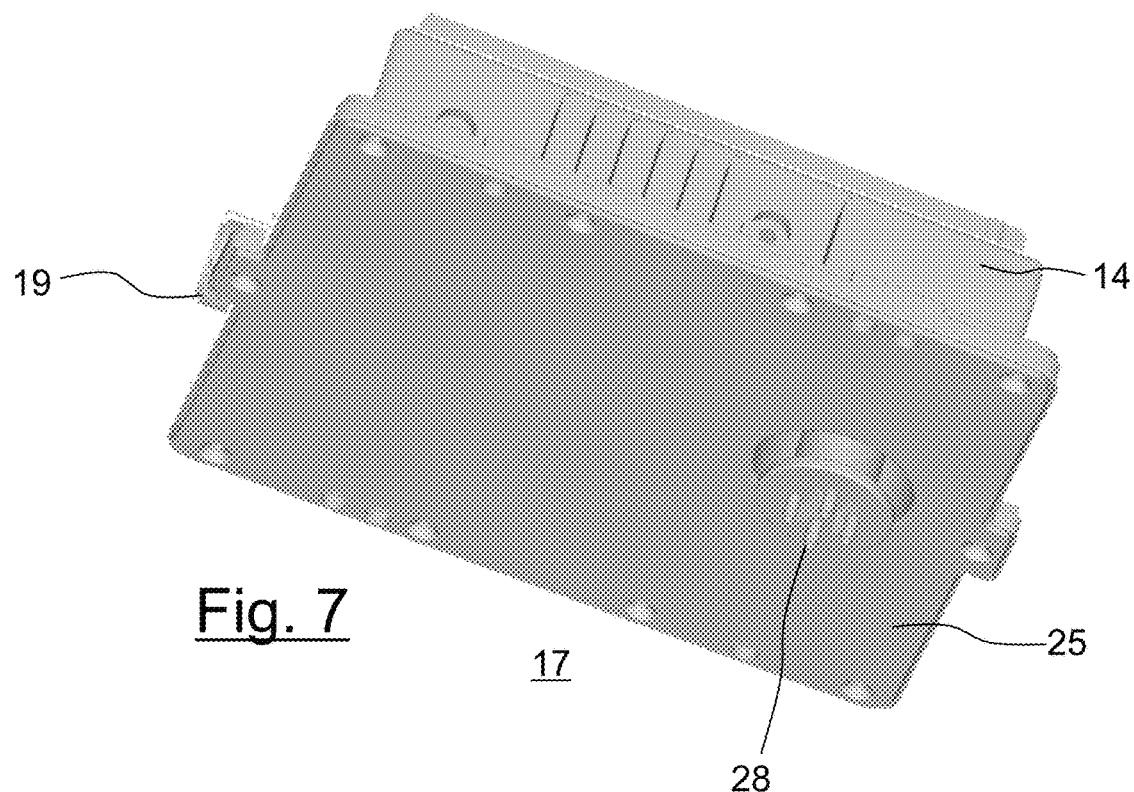
Figure 8:
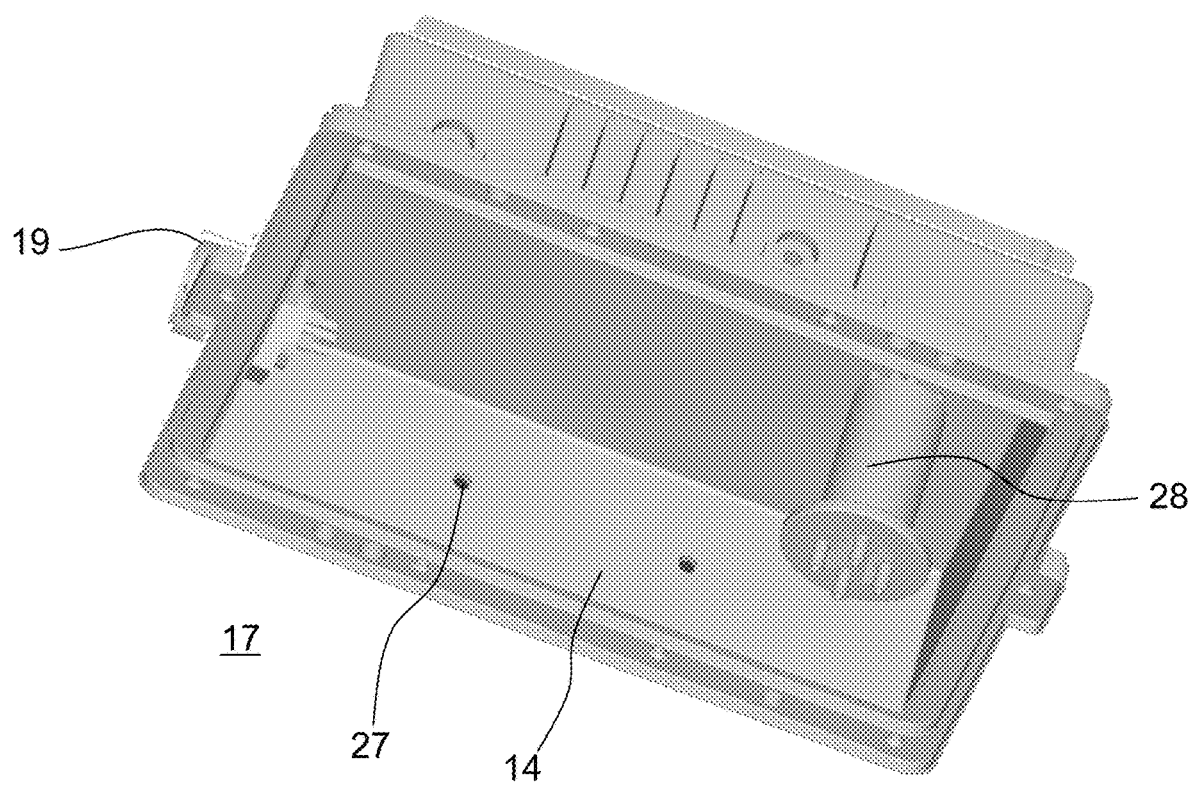

Furthermore, the reduction of mechanical stress on the DC voltage connector 28 of the power box 17 allows a ferrite 26 to be integrated around this DC voltage connector 28, i.e. to mount a ferrite coaxial with the DC voltage connector 28. To effectively limit electromagnetic interference with a ferrite 26 integrated in a power supply housing 17 of a LED module 10, it has been observed that a ferrite 26 with a height between 25 and 30 mm, an internal diameter between 15 and 20 mm and an external diameter between 25 and 30 mm is effective. To be able to use such a ferrite 26, the height of the power box 17 must be fitted. In the example in FIGS. 7 to 9, a cover 14 is used to obtain the desired height of the power supply unit 17 to integrate the ferrite 26. As shown in FIG. 9, the circuit board 33 of power box 17 is preferentially placed closest to the top face of the cover 14 to limit the absorption of the heat emitted for the circuit board 11 of module 10.

The circuit board 33 of the power supply unit 17 is preferentially connected to a sealed alternative connector 19 so that the power supply cable 18 can be separated from the power supply unit 17. To do this, cable 18 has a sealed alternating connector 20 cooperating with the sealed alternating connector 19 of the power box 17. Preferably, connector 20 of cable 18 is a male connector and connector 19 on power box 17 is a female connector.

Connector 19 of power box 17 can also be combined with a plug to protect connector 19 when cable 18 is not connected with the power box 17.

To ensure sealing inside the supply unit 17, injection holes 27 are used to inject a heat resin when the cover 24 is attached to the bottom plate 25. Alternatively or in addition, the seal between the cover 24 and the bottom plate 25 can be ensured by a seal 34 squeezed at the interface between the cover 24 and the bottom plate 25, as shown in FIG. 9. Preferably, the cover 24 is made of aluminum and has fins to improve the heat dissipation of the power unit 17. The components that emit heat inside the power box 17 can therefore be embedded in the heat resin and the heat is led inside this resin to the cover 24, which diffuses this heat in the rear part of the LED module 10.

The presently disclosed embodiments thus allow to obtain a sealed power supply unit 17 and allows a quick mounting on the LED module 10 by screwing the bottom plate 25 to the contact of the seal 23 mounted on the socket 21. Furthermore, the power supply unit 17 incorporates a ferrite 26 in order to limit electromagnetic interference while guaranteeing sealing because the ferrite 26 is integrated into the sealed unit of the power supply unit 17.

The invention claimed is:

1. A module for a digital display panel, the module comprising:
    an electronic board whose first face presents a network of light emitting diodes arranged in rows and columns with a substantially constant pitch;
    a chassis mounted on a second face of the electronic board, opposite the first face; and
    a water permeable connector mounted on the second face of the electronic board;
    wherein the chassis has a base surrounding the water permeable connector, a top part of the base having at least one groove wherein a seal is inserted, and wherein the module has a power supply box with a continuous voltage connector surrounded by a ferrite and inserted into the water permeable connector, with the power supply box being attached to the chassis so that a bottom plate of the power supply box cooperates with the seal of the base to ensure sealing around the water-permeable connector and the continuous voltage connector of the power supply box.

2. The module according to claim 1, wherein the mounting of the power supply box on the chassis is ensured by at least two screws passing through an opening of the bottom plate of the power supply box and screwed into mounting studs of the chassis.

3. The module according to claim 1, wherein the power supply box comprises a cover fixed on the bottom plate, a thermal resin being injected into the power supply box between the cover and the bottom plate.

4. The module according to claim 3, wherein the cover is made of aluminum.

5. The module according to claim 3, wherein the cover contains heat dissipation fins.

6. The module according to claim 1, wherein the power supply box comprises a sealed alternating connector intended to cooperate with a sealed alternating connector of a power supply cable.

7. The module according to claim 6, wherein the sealed alternating connector of the power supply box contains a plug to protect the sealed alternating connector when the power supply cable is not connected with the power supply box.

8. The module according to claim 1, wherein the top part of the base has two grooves and the seal has a first face with two lips entering the two grooves of the base and a second face having a hemicylindrical shape.

9. The module according to claim 1, wherein the chassis comprises a central grid, on which the base is mounted.

10. The module according to claim 1, where the digital display panel comprises a set of modules arranged in rows and/or columns.

* * * * *